(12) United States Patent
Kirichenko

(10) Patent No.: US 6,486,694 B1
(45) Date of Patent: Nov. 26, 2002

(54) UNIVERSAL DELAY-INSENSITIVE LOGIC CELL

(75) Inventor: Alexander F. Kirichenko, Elmsford, NY (US)

(73) Assignee: Hypres, Inc., Elmsford, NY (US)

( * ) Notice: Subject to any disclaimer, the term of this patent is extended or adjusted under 35 U.S.C. 154(b) by 210 days.

(21) Appl. No.: 09/629,823

(22) Filed: Jul. 31, 2000

(51) Int. Cl.[7] .............................................. H03K 19/195

(52) U.S. Cl. ................... 326/3; 326/4; 326/6

(58) Field of Search ........................ 326/2–7

(56) References Cited

U.S. PATENT DOCUMENTS 5,164,618 A * 11/1992 Murphy et al. ............. 307/476
6,242,939 B1 * 6/2001 Nagasawa et al. ............ 326/3

* cited by examiner

*Primary Examiner*—Michael Tokar
*Assistant Examiner*—Anh Q. Tran
(74) *Attorney, Agent, or Firm*—Pillsbury & Winthrop LLP

(57) ABSTRACT

The invention provides a universal, delay-insensitive RSFQ logic cell comprising two input circuits and two clock circuits, each containing a plurality of Josephson elements. The two input circuits generate and sustain persistent currents in response to input currents. The first clock circuit is arranged to be in electrical contact with the first input circuit such that a portion of the SFQ persistent current from the input circuit combines with an SFQ pulse, generated in the clock circuit, to trigger the generation of a SFQ output pulse. The second clock circuit and the second input circuit are connected in a similar manner. The first input circuit is arranged to be in electrical contact with the second input circuit so that a portion of their SFQ currents combine and trigger the generation of a SFQ output pulse. The universal logic cell can be configured to perform various digital/logical functions. For example, by merging various inputs and outputs one can get a delay-insensitive half-adder where one output gives the AND operation and a combination of the other two gives the exclusive OR operation. Another configuration yields a D flip-flop with complementary outputs.

5 Claims, 2 Drawing Sheets

US 6,486,694 B1

UNIVERSAL DELAY-INSENSITIVE LOGIC CELL

BACKGROUND OF THE INVENTION

1. Field of the Invention

This invention relates generally to logic circuits. More specifically, this invention is directed to a configuration of a logic cell that has reduced sensitivity to delay.

2. General Background and Description of Related Art

A Josephson junction is formed by creating a weak link (typically a tunnel junction) between two superconductors. The junction can switch between a superconducting state and a normal state over a time interval on the order of picoseconds. Since a change in the voltage across the junction accompanies this change in state, and the associated switching speed is much greater than that of a semiconducting junction, a significant potential exists for constructing superconducting logic circuits that operate much faster than semiconducting logic circuits.

A superconductor is an example of a macroscopic quantum system. As such, it can be described by a quantum mechanical wavefunction having a characteristic phase, $\phi_i$. The current density within any quantum system is proportional to the gradient of the wavefunction and its complex conjugate thus making it a function of the spatial variation of $\phi_i$. Since the two superconductors surrounding the Josephson junction have different phases ($\phi_1$ and $\phi_2$), they can be expected to generate a current flow across the junction as a function of their phase difference, $\phi$ (where $\phi = \phi_1 - \phi_2$). Specifically, the superconducting current is given by, $$I_S = I_C \sin\phi(t) \text{ where } d\phi/dt = 2\pi V/\Phi_0$$

$\Phi_0$ is one quantum of magnetic flux ($2.07 \times 10^{-15}$ Wb), $I_c$ is the junction's critical current, and V is the voltage across the junction. Two types of currents across the junction are evident. A direct, nondissipative super-current flows for V=0, and a dissipative normal current flows for V≠0. In addition, for a changing V within the junction, there is the usual displacement current associated with a varying electric field. Adding all these components and writing V and the electric field in terms of $\phi$ gives for the total current, $$I = I_c \sin\phi(t) + (\Phi_0 G/2\pi)d\phi/dt + (\Phi_0 C/2\pi)d^2\phi/dt^2 \quad (1)$$

where G is the conductance across the junction and C is the capacitance of the junction. Writing this equation in terms of dimensionless variables gives, $$i = \sin\phi(\tau) + d\phi/d\tau + \beta d^2\phi/d\tau^2,$$

where $$i = I/I_c, \tau = (2\pi I_c/\Phi_0 G)t \text{ and } \beta = 2\pi I_c C/\Phi_0 G^2 \quad (2)$$

Equation 1 is similar to one describing a driven damped pendulum with I corresponding to the driving force, $\phi$ corresponding to the displaced angle of the pendulum, G corresponding to the damping force, and C corresponding to the inertial mass. With a suitable choice of G, the junction can be made to operate in a mode that is critically-damped, over-damped, or under-damped, just as in the case of the pendulum. In equation 2, $\beta$ is known as the McCamber-Stewart parameter. The junction will be over-damped for $\beta < 1$, and under-damped for $\beta > 1$.

An under-damped junction is said to be hysteretic because even after the total flow of current I, goes to zero (i.e. there is no driving force) $\phi$ still oscillates (due to the "inertia") giving rise to an alternating voltage across the junction that takes some time to damp out. Eventually the junction does latch within the superconducting state, but the associated time delay can be significant. When current is applied a similar oscillatory motion can occur before steady state equilibrium is reached.

There are two fundamental paradigms around which to construct Josephson junction logic circuits. The first is to view data in terms of the voltage state of the junction, in which case the logic circuits are designed to latch the junction in either the zero voltage state or in the non-zero voltage state. Since the non-zero voltage state requires a minimum conductance to prevent significant power consumption, and small G means small damping, such a voltage latching approach requires an under-damped (i.e. hysteretic) junction, which partially relinquishes the speed advantage of superconducting logic circuits. The other paradigm is to view data in terms of the fluxes of the magnetic fields (B-fields) produced by the superconducting currents circulating across the loops within the logic circuit. Since a voltage pulse is associated with the generation and transfer of these fluxes, it is the transition between voltage states and not the states themselves that is important, allowing the use of over-damped junctions (i.e. junction with a relatively large shunt conductance), and giving this approach a marked advantage over the latching approach.

In addition to being related to the voltage across the Josephson junction, $\phi$ is directly related to the flux of the magnetic field. Therefore, changes in $\phi$ are associated with changes in the magnetic flux as well as in changes in the voltage. However, since $\Phi_0$ is the most elementary unit of magnetic flux, also known as a single flux quantum (SFQ), the change in $\phi$ must be sufficient to generate at least one SFQ to effect a change in the flux.

The SFQ approach to storing and manipulating data via under-damped Josephson junctions is known as Rapid Single Flux Quantum (RSFQ). A SFQ is generated by using a current to trigger a $2\pi$ change in $\phi$ across an over-damped junction. Typically the junction is biased with a direct current just below $I_c$ and then driven into the normal state (i.e. switched) with the addition of an input current (which sums the total current to above $I_c$). From (1) and the pendulum analogy this process is seen as analogous to maintaining the pendulum at just below the horizontal ($\phi = \pi/2$) and then kicking it up past the vertical with a sufficiently large input torque. The system then spontaneously rotates and, if sufficiently damped, returns just shy of its starting point after traversing essentially $2\pi$ radians. The SFQ that results can be detected via its associated voltage pulse V(t), which is very short and of quantized area:

$$\int V(t)dt = \Phi_0 \approx 2.07 \text{ mV·ps}$$

The SFQ can be allowed to dissipate out of the circuit or it can be trapped by allowing it to establish a persistent current within a superconducting loop having a stabilizing self-inductance (i.e. $L \approx \Phi_0/I$).

Typically, bit-wise logic functions are performed by synchronizing a predetermined interaction between SFQ pulses. Usually the time window within which the input pulses are constrained to appear at the pertinent Josephson junction is small enough to be considered simultaneous. Pulses arriving outside this time window will cause the junction to generate either no pulse, or, in the case of arrival times not very far outside this window, more than one pulse. Input delay insensitivity is a major factor determining the performance of superconducting logic circuits. And while a 300 GHz clock frequency is attainable, such circuits are extremely sensitive to input delay. The inability of a logic gate to process multiple input signals in parallel (i.e. independently of their arrival times) dramatically reduces the circuit operating frequency, and therefore its performance. Most RSFQ multi-polar circuits have this drawback; specifically that the input signals are required to arrive and/or prohibited from arriving simultaneously. It is therefore desirable to obtain a delay insensitive logic circuit that can process multiple input signals in parallel independently of their arrival times.

SUMMARY OF THE INVENTION

The invention provides a universal, delay-insensitive RSFQ logic cell having a first and a second Josephson input circuit with first and second data input lines respectively. Each input circuit contains a plurality of Josephson elements arranged to generate a SFQ pulse and sustain an associated SFQ persistent current in response to an input signal applied to its respective data input line. First and a second Josephson clock circuits are provided with respective first and second clock input lines. Each clock circuit includes a plurality of Josephson elements arranged to generate a SFQ clock pulse in response to an input signal applied to its respective clock input line. The first Josephson clock circuit is arranged to be in electrical contact with the first Josephson input circuit such that a portion of the SFQ persistent current from the first input circuit combines with a portion of the SFQ clock pulse from the first clock circuit to trigger the generation of a first SFQ output pulse. The second Josephson clock circuit and the second Josephson input circuit are connected similarly to the first clock and input circuits. The first Josephson input circuit is arranged to be in electrical contact with the second Josephson input circuit so that a portion of the SFQ current from the first data circuit combines with a portion of the SFQ current from the second data circuit such as to trigger the generation of a third SFQ output.

The universal logic cell can be configured to perform various digital/logical functions. For example, by merging various inputs and outputs the universal cell can be configured to be a delay-insensitive half-adder. One output provides a logical AND, and a combination of the other two outputs provide an exclusive OR. The universal cell can also be configured to provide a D flip-flop with complementary outputs.

DETAILED DESCRIPTION OF THE INVENTION

Figure 1:
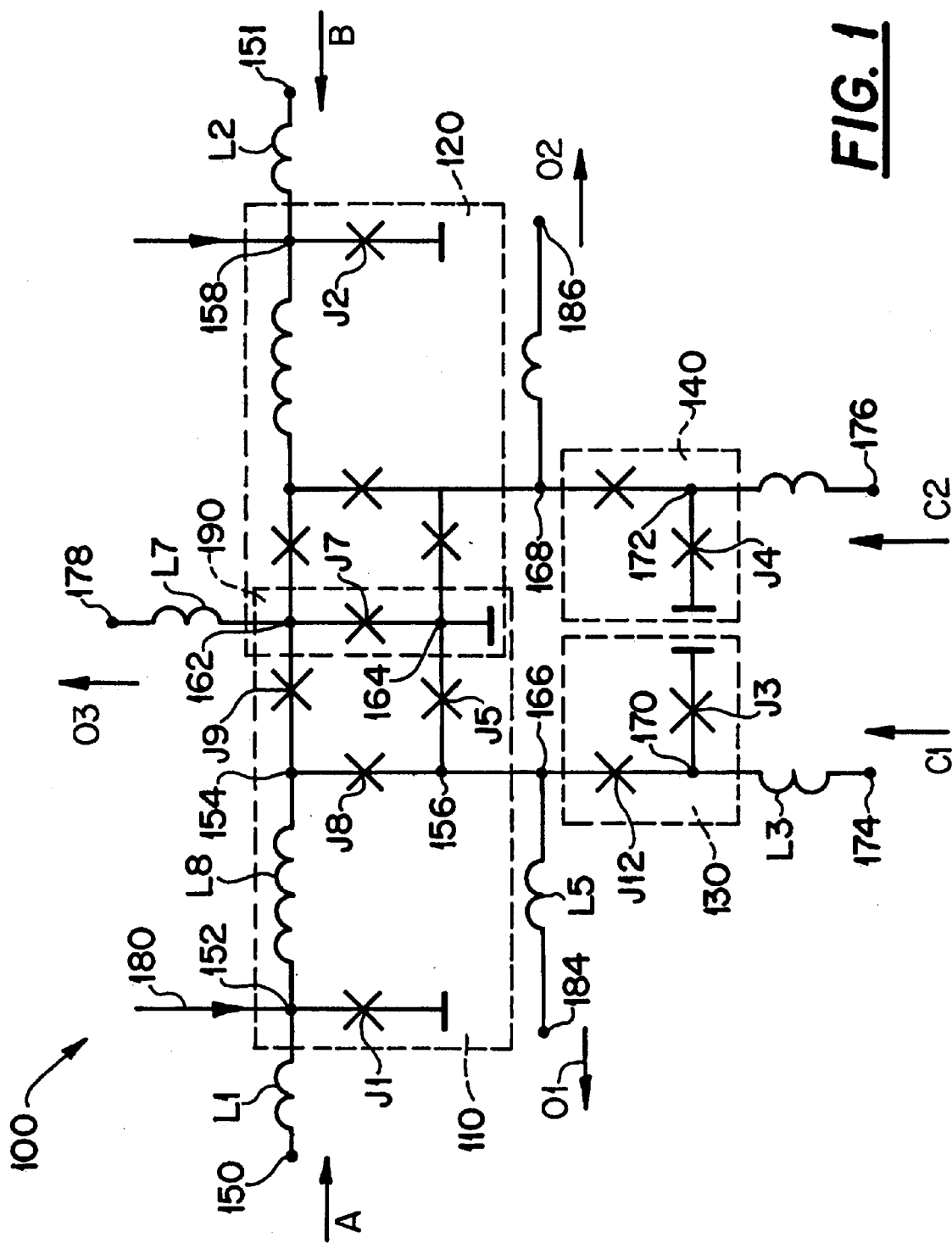
FIG. 1 is a circuit diagram of the universal delay-insensitive logic cell according to the invention.

FIG. 1 is a circuit diagram of the logic cell 100 constructed in accordance with the invention. Logic cell 100 comprises four constituent circuit units: input circuit one (IC1) 110, input circuit two (CC2) 120, clock circuit one (CC1) 130, and clock circuit two (CC2) 140. IC2 and CC2 are identical to IC1 and CC1 respectively. All Josephson junctions J1-J13 are non-hysteretic and are designated by a cross. The input, output, and clock current pulses are represented by arrows with associated alphanumeric designations (e.g. B is the input current pulse to input circuit two).

Input pulse A, applied to node 150, is fed to node 152 in IC1 via input inductor L1. Josephson junction J1 is biased by bias current 180 such that the sum of the input current and the bias current is more than the critical current of junction J1. As a result, junction J1 generates a SFQ in response to input pulse A, and establishes a persistent current that travels in a loop from node 152 to node 154, where it splits; one part gets to node 164 via junction J8 and J5 while the other part gets to node 164 via junction J9 and J7. From there the current returns through ground and so sustains the SFQ. The value of L8 is chosen such that it is sufficiently large to localize the SFQ but sufficiently small to be incapable of trapping two or more SFQ's.

IC2 functions identically to IC1 and is connected to it via a circuit section 190. In circuit section 190, input circuits 110 and 120 intersect at nodes 162 and 164, and share Josephson junction J7. Josephson junction J7 is biased to switch and generate a SFQ, with the associated pulse detected as output pulse O3 at node 178 via inductor L7 only when the current through the junction from the persistent current in IC1 adds to the SFQ pulse generated by Josephson junction J2 from input pulse B applied via inductor L2 from node 151. Therefore, since both input pulse A and input pulse B are needed to generate output pulse O3, and the establishment of a persistent current in IC1 or IC2 obviates the need for simultaneous arrival of the input pulses, the invention constitutes a delay insensitive AND gate with respect to input A and input B.

In addition to generating an output pulse at node 178, the switching of J7 redirects the current in IC1 such that it all goes through junction J8, which causes J8 to switch, thereby terminating the persistent current and the associated SFQ. A similar sequence occurs simultaneously in IC2, and the two taken together can be viewed as the mutual annihilation of two SFQ's of opposite orientations.

For a persistent clockwise current in IC1, the portion traveling from node 156 through Josephson junction J5 to node 164 is not sufficient, by itself, to trigger an SFQ from junction J5. However, a clock pulse C1 applied at node 174 and transmitted to node 170 in clock circuit 130 via input inductor L3 drives Josephson junction J3 into generating a SFQ. The associated pulse arrives at node 156 via junction J12, and sums with the persistent current from node 156 to node 164, to trigger junction J5 into generating a SFQ. The associated pulse is read out as output pulse O1, which is communicated to node 184 from node 166 via output inductor L5. Note that, as described in the prior paragraph, a SFQ pulse generated by junction J7 would halt the persistent current flowing from node 156 to node 164, meaning output O1 represents the delay insensitive logical operation, A AND C1 AND !B, where "!" is the logical operation NOT. Clock circuit 140 is identical to clock circuit 130 and the entire logic circuit has left-right symmetry, therefore, for a clock pulse C2 applied at node 176, junction J4 generates a SFQ, and output O2 taken at node 186 gives, B AND C2 AND !A.

In addition to generating an output pulse at node 184, the switching of J5 redirects the persistent current in IC1 such that it all goes through junction J9, which causes J9 to switch, thereby terminating the persistent current and the associated SFQ. A similar action results when a clock pulse C2, applied at node 176, combines with a persistent current in IC2.

The logical operation of the logic cell is summarized in the following logic table.

| Output | O1 | O2 | O3 |
| --- | --- | --- | --- |
| Output Value | C1 & A & !B | C2 & B & !A | A & B |

Figures 2, 3:
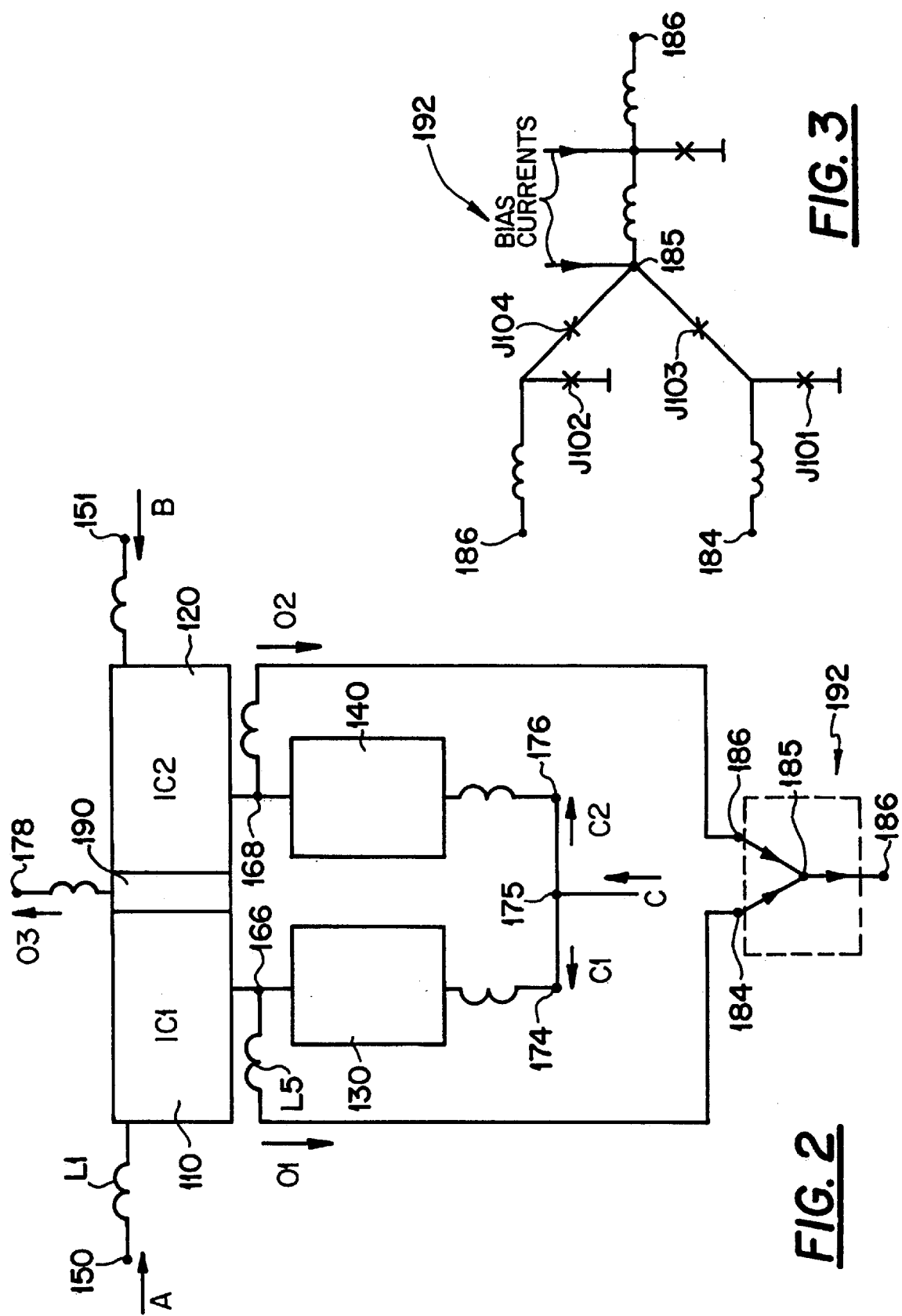
FIG. 2 is a delay-insensitive half-adder embodiment of the invention.
FIG. 3 is a confluence buffer circuit implementation used with the half-adder embodiment of the invention.

The invention can be configured to perform various digital/logical functions. For example, FIG. 2 shows a delay insensitive half-adder obtained by joining clock inputs C1 and C2 and merging outputs O1 and O2. As can be seen from the logic table below, where in this case C2=C1=C, output O3 gives the AND operation, and the merger of O1 and O2 (i.e. O1 OR O2) gives the XOR (exclusive OR) operation.

| Output | O1 OR O2 | O3 |
| --- | --- | --- |
| Output Value | (C1 & A & !B) OR (C2 & B & !A) = C & [(A & !B) OR (B & !A)] = C & (A XOR B) | A & B |

Nominal critical currents are: J5—0.303 mA, J7—0.171 mA, J8—0.245 mA, J9—0.125 mA, and J12 —0.303 mA. The critical currents of J1–J4 are those of the Josephson transmission line supplying the signals. Nominal inductances are: L5—4.45 pH, L7—6.47 pH, and L8—2.65 pH. The inductances of L1–L4 are those of the Josephson transmission lines supplying the signals.

FIG. 3 shows details of the well-known confluence buffer 192, which can be used to implement the merger of outputs O1 and O2. Its purpose is to isolate the outputs so that an SFQ pulse on O1 is not transmitted to O2. This is accomplished by inserting junctions J102 and J104 between nodes 186 and 185, and inserting junctions J101 and J103 between nodes 184 and 185 as shown. The critical currents of J103 and J104 are less than that of J101 and J102 respectively; therefore, a pulse applied to node 185 via node 186 will be applied to J103 and J101 on its way to ground, but J103 will reach its resistive state first, and perform the $2\pi$ change of phase, preventing J101 from making the similar leap. Hence the voltage across J101 remains close to zero, which means the SFQ pulse does not reach node 184. Similarly a pulse applied to node 185 via node 184 never reaches node 186.

Also, from the logic table below, it can be seen that the connection of clock input C2 and input B, which in this case means B=C2=C, yields a D flip-flop with complementary outputs, where output O3 equals input A, and output O2 is !A.

| Output | O2 | O3 |
| --- | --- | --- |
| Output Value | C & C & !A = C & !A | C & A |

The invention is not limited to the particular merger of inputs and outputs described above. Instead the particular mergers described are shown as examples of the versatility of the logical cell. Any combination of inputs and outputs that gives outputs that are logical functions of the inputs are contemplated by the invention. In addition, for clarity L1 and J1, L2 and J2, L3 and J3, and L4 and J4 are shown as part of the invention, but their inclusion is not a necessity. Instead they can be seen as the final legs in four Josephson transmission lines that terminate at nodes 152, 158, 170 and 172 respectively. The input to IC1 would therefore be at node 152 and the input to IC2 would be at node 158. Likewise, the clock inputs would be at nodes 170 and 172.

It can thus be appreciated that the objectives of the present invention have been fully and effectively accomplished. The foregoing specific embodiments have been provided to illustrate the structural and functional principles of the present invention and is not intended to be limiting. To the contrary, the present invention is intended to encompass all modifications, alterations, and substitutions within the spirit and scope of the appended claims.

What is claimed is:

1. A logic cell, comprising:
   a. a first and a second Josephson input circuit with first and second data input lines respectively, each said input circuit containing a plurality of Josephson elements arranged to generate a SFQ pulse and sustain a SFQ persistent current in response to an input signal applied to the respective data input line,
   b. a first and a second Josephson clock circuit with first and second clock input lines respectively, each said clock circuit containing at least one Josephson element arranged to provide a SFQ clock pulse in response to an input pulse applied to the respective clock input line,
   c. said first Josephson clock circuit being arranged to be in electrical contact with said first Josephson input circuit such that a portion of said SFQ persistent current from said first input circuit combines with a portion of said SFQ clock pulse from said first clock circuit to trigger the generation of a first SFQ output pulse,
   d. said second Josephson clock circuit being arranged to be in electrical contact with said second Josephson input circuit such that a portion of said SFQ persistent current from said second input circuit combines with a portion of said SFQ clock pulse from said second clock circuit to trigger the generation of a second SFQ output pulse,
   e. said first Josephson input circuit arranged to be in electrical contact with said second Josephson input circuit at a common circuit portion such that a portion of said SFQ persistent current from said first input circuit combines with a portion of said SFQ persistent current from said second input circuit within said common circuit portion to trigger the generation of a third SFQ output pulse.

2. A logic cell according to claim 1 further comprising a first, a second, and a third output line for reading out said first, said second, and said third output pulses respectively.

3. A logic cell according to claim 2 further comprising means for joining said first and said second clock input lines, and means for merging said first and said second output lines so as to provide an AND logic function output on said third output line and provide an XOR logic function output on the merged first and second output lines.

4. A logic cell according to claim 3 where said merging means comprises a confluence buffer.

5. A logic cell according to claim 2 where said second clock input line is connected to said second data input line so that said logic cell behaves as a D flip flop with said third output line providing an output signal that is equal to that on said first input line, and said second output line providing an output signal that is equal to the inverse of that on said first input line.

* * * * *